United States Patent
Yeh

(10) Patent No.: US 8,654,492 B2
(45) Date of Patent: Feb. 18, 2014

(54) ELECTROSTATIC DISCHARGE PROTECTION APPARATUS AND METHOD THEREFOR

(75) Inventor: Chih-Ting Yeh, Zhudong Township, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/441,642

(22) Filed: Apr. 6, 2012

(65) Prior Publication Data

US 2013/0128400 A1 May 23, 2013

(30) Foreign Application Priority Data

Nov. 17, 2011 (TW) .............................. 100142091 A

(51) Int. Cl.
*H02H 9/04* (2006.01)
(52) U.S. Cl.
USPC .......................................................... 361/56
(58) Field of Classification Search
USPC .......................................................... 361/56
See application file for complete search history.

(56) References Cited

U.S. PATENT DOCUMENTS

| | | | |
|---|---|---|---|
| 5,946,177 A | 8/1999 | Miller et al. | |
| 7,027,275 B2 | 4/2006 | Smith | |
| 7,079,369 B2 * | 7/2006 | Hulfachor et al. | 361/111 |
| 7,605,431 B2 | 10/2009 | Chen | |
| 2005/0002139 A1 * | 1/2005 | Yeh et al. | 361/43 |
| 2007/0285854 A1 | 12/2007 | Rodgers et al. | |
| 2009/0140339 A1 * | 6/2009 | Kim | 257/355 |
| 2010/0296212 A1 | 11/2010 | Liang et al. | |

FOREIGN PATENT DOCUMENTS

TW 201042747 12/2010

OTHER PUBLICATIONS

Quittard, et al., "ESD Protection for High-Voltage CMOS Technologies", 2006 EOS/ESD Symposium, Sep. 10-14, 2006, pp. 2A.4-1-2A.4-10.
Li, et al., "A Compact, Timed-shutoff, MOSFET-based Power Clamp for On-chip ESD Protection", 2004 EOS/ESD Symposium, Sep. 19-23, 2004 7 pages.
Chen, et al., "Area-Efficient ESD-Transient Detection Circuit With Smaller Cakpacitance for On-Chip Power-Rail ESD Protection in CMOS ICs", IEEE Transactions on Circuits and Systems-II: Express Briefs, vol. 56, No. 5, May 2009, pp. 359-363.

(Continued)

*Primary Examiner* — Jared Fureman
*Assistant Examiner* — Nicholas Ieva
(74) *Attorney, Agent, or Firm* — Muncy, Geissler, Olds & Lowe, PLLC

(57) ABSTRACT

An electrostatic discharge (ESD) protection apparatus includes a clamp circuit, a detection circuit and a control circuit. The clamp circuit has a first terminal and a second terminal respectively coupled to a first rail line and a second rail line. In response to an ESD event, the clamp circuit generates a first coupling potential at its coupling terminal. The detection circuit, coupled to the coupling terminal of the clamp circuit and the second rail line, outputs a detection signal in response to the first coupling potential. The control circuit, coupled to the first and second rail lines, the detection circuit and the clamp circuit, outputs a conduction signal to a control terminal of the clamp circuit in response to the detection signal. The clamp circuit is conducted in response to the conduction signal so that ESD between the first and second rail lines is performed through the clamp circuit.

24 Claims, 9 Drawing Sheets

(56) References Cited

OTHER PUBLICATIONS

Yeh, et al., "Capacitor-Less Design of Power-Rail ESD Clamp Circuit With Adjustable Holding Voltage for On-Chip ESD Protection", IEEE Journal of Solid-State Circuits, vol. 45, No. 11, Nov. 2010, pp. 2476-2486.

Li, et al., "Design and Characterization of a Multi-RC-triggered MOSFET-based Power Clamp for On-chip ESD Protection", 2006 EOS/ESD Symposium, Sep. 10-14, 2006, pp. 4A.3-1-4A.3-7.

* cited by examiner

US 8,654,492 B2

ELECTROSTATIC DISCHARGE PROTECTION APPARATUS AND METHOD THEREFOR

This application claims the benefit of Taiwan application Serial No. 100142091, filed Nov. 17, 2011, the disclosure of which is incorporated by reference herein in its entirety.

BACKGROUND

1. Technical Field

The disclosed embodiments relate in general to an electrostatic discharge (ESD) protection apparatus, and more particularly to an ESD protection apparatus and method therefor for between rail lines.

2. Description of the Related Art

As CMOS fabrication techniques approach a nanometer scale, a breakdown voltage of a gate oxide layer having an ever-decreasing thickness rapidly also drops along with the advancement in the fabrication techniques. However, the substantial decrease in the breakdown voltage adds complications to designs of an electrostatic discharge (ESD) protection circuit. To achieve whole-chip ESD protection, a power-rail ESD clamp circuit inevitably plays a crucial role.

A conventional power-rail ESD clamp circuit, including a detection circuit therefor, is realized by an RC circuit consisted of a capacitor and a resistor. ESD is performed by controlling a conduction period of a clamp device via a size of a time constant. Thus, in the above conventional detection circuit, it is necessary that the time constant be particularly controlled with care to distinguish between an ESD event from a power-on event. The length of the conduction period of the clamp device during an ESD event is determined by the RC time constant of the previous-stage detection circuit. A time constant that is too small renders an insufficient conduction period and reduces the ESD protection capability; whereas a time constant that is too large much likely leads to a mistrigger and conduction of the ESD protection circuit under a power-on condition.

As previously stated, the conduction period of the clamp device is dependent on the RC time constant. Assume the above detection circuit is utilized for controlling a protection circuit that generates a low-impedance conduction resistance through controlling a MOSFET device channel. Since the MOSFET device channel requires a rather long conduction period to release an ESD current, the issue of a mistrigger and conduction is also much likely caused. Meanwhile, the conventional detection circuit structure occupies a large layout area due to the capacitor and resistor adopted.

SUMMARY

The disclosure is directed to an electrostatic discharge (ESD) protection apparatus utilizing a parasitic capacitance of an ESD clamp device as a part of an ESD detection mechanism. The above structure fully utilizes an innate parasitic capacitance of the ESD clamp device to effectively reduce a layout area required by the ESD protection apparatus.

According to one embodiment, an ESD protection apparatus including a clamp circuit, a detection circuit and a control circuit is provided. The clamp circuit includes a first terminal, a second terminal, a control terminal and a coupling terminal. The first terminal and the second terminal of the clamp circuit are respectively coupled to a first rail line and a second rail line. In response to an ESD event, the clamp circuit generates a first coupling potential at the coupling terminal. The detection circuit, coupled to the coupling terminal of the clamp circuit and the second rail line, outputs a detection signal in response to the first coupling potential. The control circuit is coupled to the first rail line, the second rail line, the detection circuit and the clamp circuit. In response to the detection signal, the control circuit is enabled to output a conduction signal to the control terminal of the clamp circuit. In response to the conduction signal, the clamp circuit is conducted so that ESD between the first and second rail lines is performed through the clamp circuit.

According to another embodiment, a method for an ESD protection apparatus is provided. The method includes steps of: providing a clamp circuit having a first terminal, a second terminal, a control terminal and a coupling terminal, the first terminal and the second terminal being respectively coupled to a first rail line and a second rail line; coupling a detection circuit between the coupling terminal of the clamp circuit and one of the first and second rail lines; in response to an ESD event, generating a first coupling potential at the coupling terminal of the clamp circuit; in response to the first coupling potential, outputting a detection signal by the detection circuit; in response to the detection signal, outputting a conduction signal by a control circuit to the control terminal of the clamp circuit to conduct the clamp circuit; and, in response to the conduction signal, performing ESD between the first and second rail lines through the conducted clamp circuit.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 1:
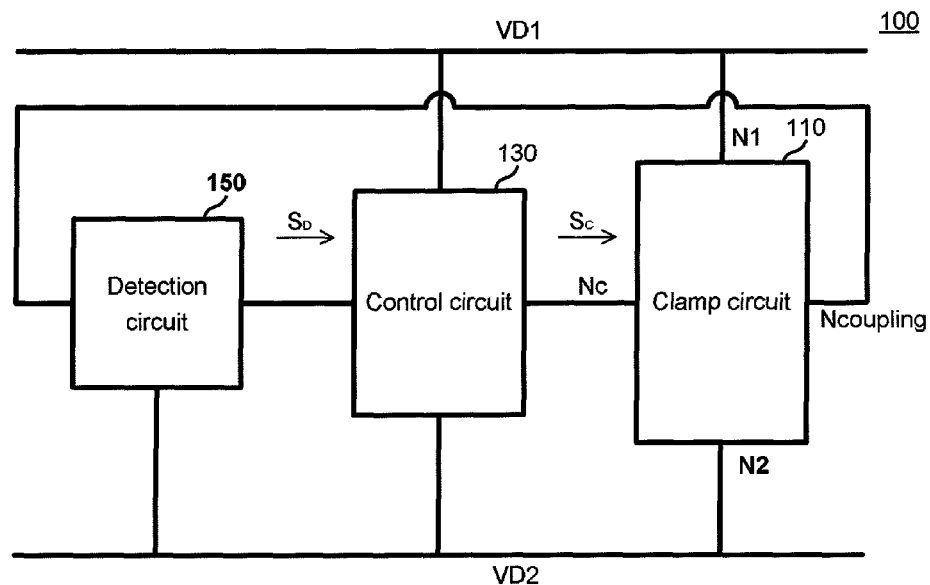
FIG. 1 is a block diagram of an ESD protection apparatus according to an embodiment.

FIG. 1 shows a block diagram of an electrostatic discharge (ESD) protection apparatus according to an embodiment. An ESD protection apparatus 100 includes a clamp circuit 110, a control circuit 130 and a detection circuit 150. The clamp circuit 110 includes a first terminal N1, a second terminal N2, a control terminal Nc and a coupling terminal Ncoupling.

The first terminal N1 and the second terminal N2 of the clamp circuit 110 are respectively coupled to a first rail line VD1 and a second rail line VD2. For example, the clamp circuit 110 includes at least one transistor as a clamp circuit 210 in FIG. 2. A parasitic diode for providing a junction capacitance is formed between the first terminal N1 and the coupling terminal Ncoupling of the clamp circuit 110. In response to an ESD event, the clamp circuit 110 generates a first coupling potential at the coupling terminal Ncoupling. The detection circuit 150 is coupled to the coupling terminal Ncoupling of the clamp circuit 110 and the second rail line VD2. In response to the first coupling potential, the detection circuit 150 outputs a detection signal $S_D$. In response to the detection signal $S_D$, the control circuit 130 is enabled to output a conduction signal $S_C$ to the control terminal Nc of the clamp circuit 110. In response to the conduction signal $S_C$, the clamp circuit 110 is conducted so that ESD between the first rail line VD1 and the second rail line VD2 is performed through the clamp circuit 110.

In response to either an end of the ESD event or a normal operating mode, the coupling terminal Ncoupling of the clamp circuit 110 is under a second coupling potential, such that the control circuit 130 is incapable of outputting the conduction signal $S_C$ due to the insufficient potential generated by the detection circuit 150, so that the clamp circuit 110 is turned off. In other words, at this point, the second coupling potential is insufficient for enabling the control circuit 130 that is then incapable of outputting a signal (i.e., the conduction signal $S_C$) having an appropriate level or size, and so the clamp circuit 110 is not conducted.

In some embodiments, the first rail line VD1 and the second rail line VD2 may be respectively coupled to two different signal sources or two different power sources. In other embodiments, the first rail line VD1 and the second rail line VD2 may be respectively coupled to a signal source or a power source, or vice versa. Alternatively, in the above coupling methods for the first rail line VD1 and the second rail line VD2, one of the rail lines may be coupled to a ground terminal. In conclusion, as an ESD event occurs between the first rail line VD1 and the second rail line VD2, ESD between the first rail line VD1 and the second rail line VD2 is performed through the clamp circuit 110.

Figure 2:
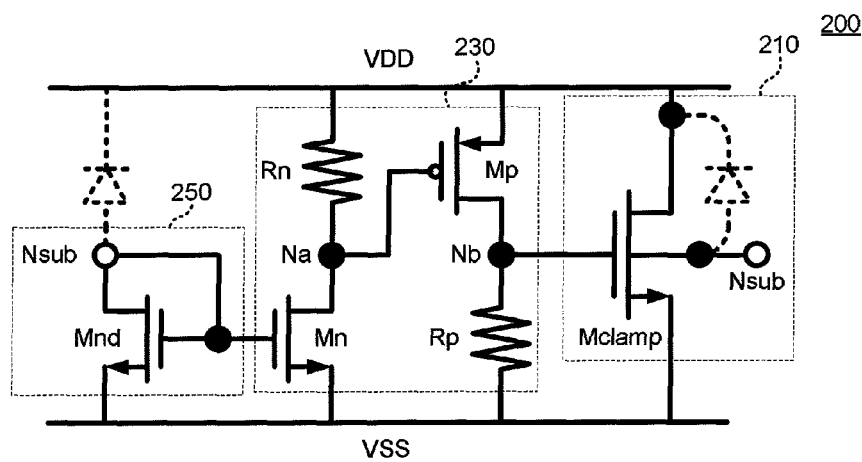
FIG. 2 is a schematic diagram of the embodiment in FIG. 1, wherein a clamp circuit is implemented by an N-type MOSFET.

FIG. 2 shows a schematic diagram of the embodiment in FIG. 1. An N-type metal oxide semiconductor field effect transistor (MOSFET) is utilized as a clamp circuit device Mclamp. An ESD protection apparatus 200 includes a clamp circuit 210, a control circuit 230 and a detection circuit 250. For example, the clamp circuit 210 includes at least one transistor as the transistor Mclamp in FIG. 2. The transistor Mclamp is a MOSFET. The clamp circuit 210 has a first terminal N1, a second terminal N2, a control terminal Nc and a coupling terminal Ncoupling respectively coupled to a drain, a source, a gate and a substrate terminal Nsub of the MOSFET. For example, the detection circuit 250 includes at least one diode-connected transistor Mnd, e.g., an NMOS device, coupled to the coupling terminal Ncoupling of the clamp circuit 210 and a second rail line, e.g., VSS. The detection circuit 250 has one terminal coupled to the coupling terminal Ncoupling of the clamp circuit 210 and the control circuit 230, and the other terminal coupled to the second rail line VSS.

Figure 3:
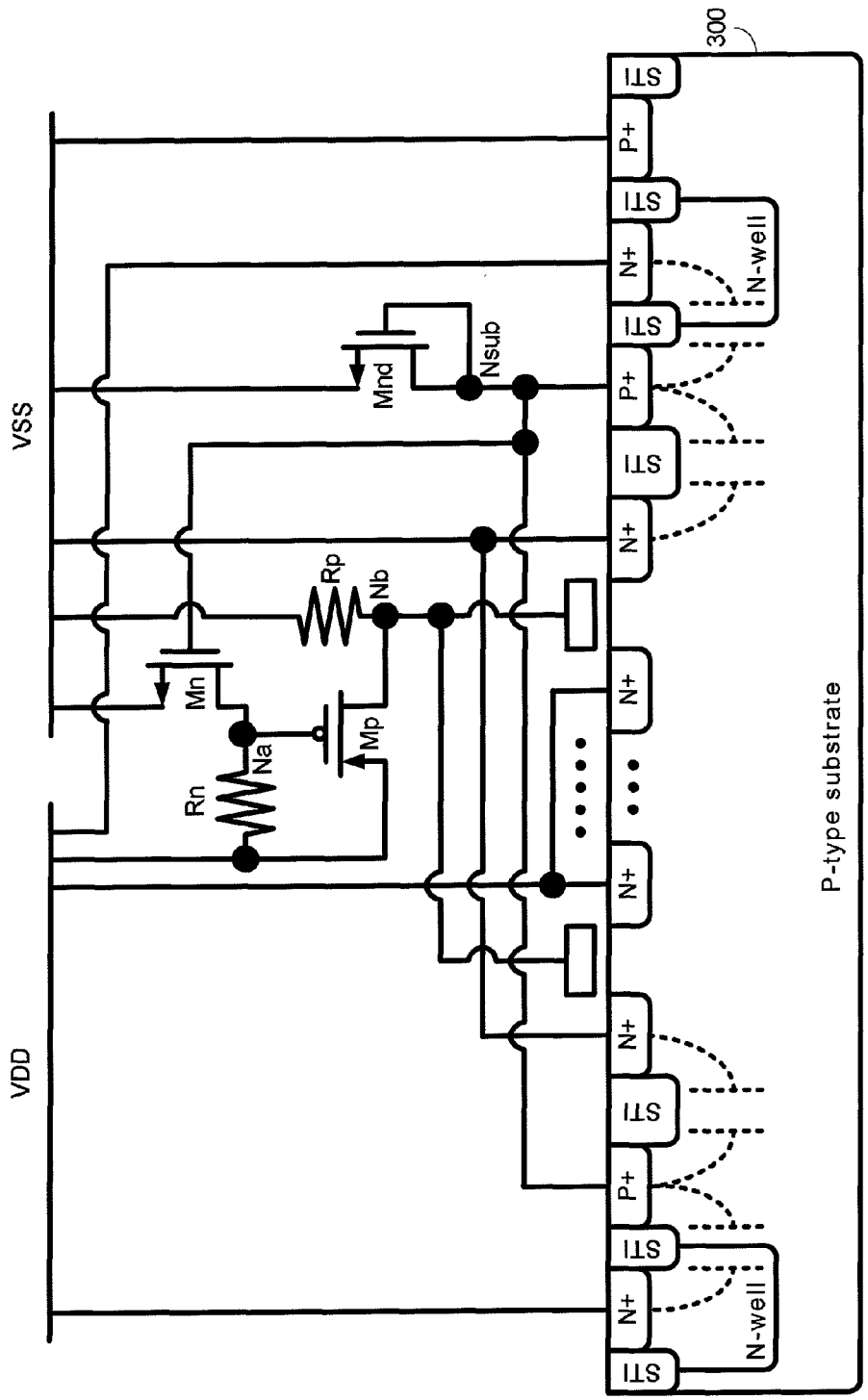
FIG. 3 is a circuit layout of the embodiment in FIG. 2.

The ESD protection apparatus 200 utilizes the parasitic capacitance of the ESD clamp device Mclamp as a part of the ESD detection mechanism. FIG. 3 shows a circuit layout of the embodiment in FIG. 2. An Mclamp 300 shows a sectional view of an NMOS transistor manufactured by a standard CMOS layout process as the Mclamp. A parasitic diode for providing a junction capacitance is formed between a drain and a substrate of the Mclamp. A substrate terminal Nsub generates a coupling potential in the occurrence of an ESD event. In certain layout approaches, a semiconductor structure (including an N-well and N+ established on the N-well) of an N+ guard ring is disposed to surround a periphery of the Mclamp device. An N+/Psub junction capacitance is also formed between the semiconductor structure of the N+ guard ring and the substrate of the Mclamp. Contributed by the above junction capacitances, a sufficient coupling potential is generated at the substrate terminal Nsub in the occurrence of an ESD event. Further, in an embodiment, for example, the clamp device Mclamp is implemented by a large-channel metal oxide semiconductor field effect transistor (BigFET).

In FIG. 2, the substrate terminal Nsub of Mclamp is connected to diode-connected NMOS device, i.e., a transistor Mnd. Therefore, in the ESD protection apparatus 200 under normal operations of a system circuit, Nsub is connected to the potential of VSS, e.g., a ground point. At this point, Mclamp is under a turned-off state, i.e., Mclamp is not conducted.

In the occurrence of an ESD event, a voltage surge at the first rail line pulls up the voltage level of Nsub due to the coupling effect of the parasitic capacitance. When the voltage level of Nsub (which is equal to the foregoing first coupling potential at this point) is higher than a threshold voltage of the NMOS device, the situation at the present time may be regarded as the detection circuit 250 outputting a detection signal $S_D$. In response to the detection signal $S_D$, the control circuit 230 generates a conduction signal $S_C$ at the node Nb. The clamp device Mclamp then becomes conducted in response to the conduction signal $S_C$.

For example, the control circuit 230 is implemented by a circuit having an inverting function to generate a conduction signal $S_C$ at the node Nb in response to the detection signal $S_D$. For example, the control circuit 230 includes a first inverting circuit (e.g., a transistor Mn and a resistor Rn) and a second inverting circuit (e.g., a transistor Mp and a resistor Rp). The first inverting circuit has an output terminal (e.g., a node Na) coupled to an input terminal of the second inverting circuit. The second inverting circuit has an output terminal (e.g., the node Nb) coupled to the control terminal (e.g., the gate of the transistor Mclamp) of the clamp circuit 210.

For example, when the voltage level of Nsub is higher than the threshold voltage of the NMOS device in the occurrence of an ESD event, the situation at the present time may be regarded as the detection circuit 250 outputting a detection signal $S_D$. At this point, the voltage at the node Na is pulled down to a low potential due to the conducted device Mn. Meanwhile, the voltage at the node Nb is pulled up to a same voltage potential as that of the first rail line due to the conducted device Mp, so as to successfully conduct the clamp device Mclamp.

The number of stages of the inverting circuits in the above approach for realizing the control circuit 230 may be determined by electrical characteristics of the clamp circuit 210. For example, the inverting circuits may be two-stage, four-stage or inverting circuits having other stages. Further, the control circuit 230 is not limited to the above inverting circuits. A circuit capable of generating an appropriate conduction signal in response to the coupling potential of the node Nsub for conducting the clamp circuit 210 can be utilized. Similarly, the detection circuit 250 in FIG. 2 may be implemented by a circuit having an equivalent resistance, e.g., a resistor or a circuit formed by other devices. That is, the detection circuit 250 is not limited to the above example formed by the transistor. A circuit capable of generating an appropriate detection signal in response to the coupling potential of the node Nsub for conducting the clamp circuit 210 can be utilized.

In practice, by implementing the circuit having appropriate device sizes, mistrigger caused by a fast power-on can be prevented. Further, the ESD detection circuit does not include a positive feedback mechanism, and so the structure is immune from latch-up effects that are resulted by transient noise. In certain embodiments, due to the substantial N+/Psub parasitic capacitance in Mclamp, the devices of the ESD detection circuit may be realized by small-size devices to significantly reduce an overall layout area of the ESD clamp circuit.

Figure 4:
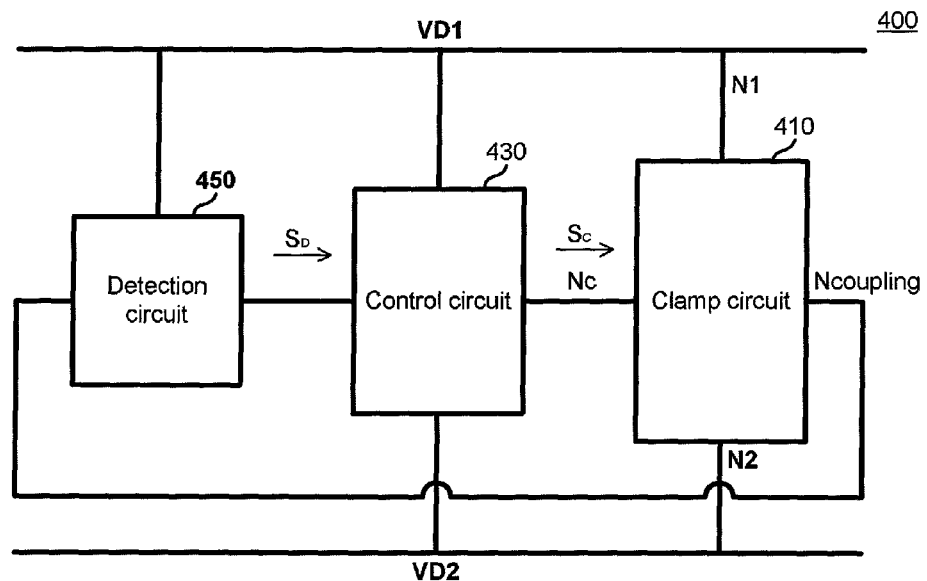
FIG. 4 is a block diagram of an ESD protection apparatus according to another embodiment.
Figure 5:
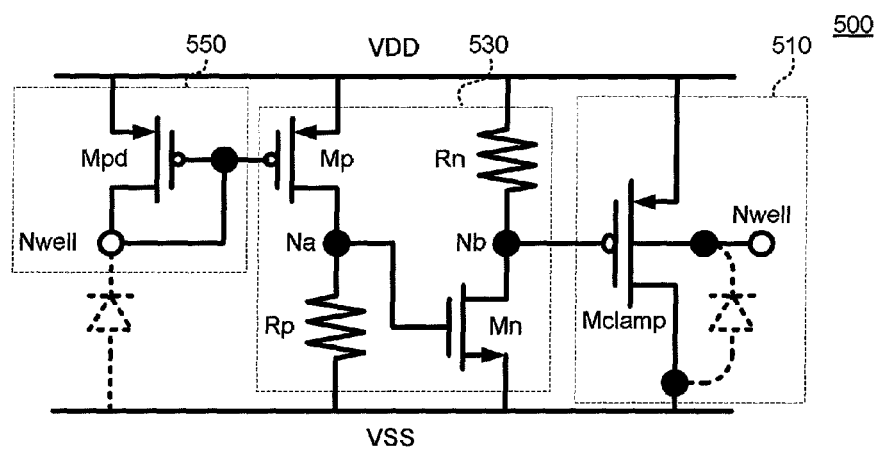
FIG. 5 is a schematic diagram of the embodiment in FIG. 4, wherein a clamp circuit is implemented by a P-type MOSFET.

FIG. 4 shows a block diagram of an ESD protection apparatus according to another embodiment. An ESD protection apparatus 400 includes a clamp circuit 410, a control circuit 430 and a detection circuit 450. Two main differences between the embodiment in FIG. 1 and the embodiment in FIG. 4 are that, the detection circuit 450 is coupled to the first rail line VD1, and the clamp circuit 410 is implemented by a different type of transistor from that of the clamp circuit 110 in FIG. 1. As shown in FIG. 5, the clamp circuit 510 adopts a P-type MOSFET. Further, from a symmetry perspective, since the clamp circuit and the control circuit are both coupled between the two rail lines and the detection circuit is coupled to one of the rail lines, the circuits in FIGS. 1 and 4 may be regarded as the same embodiment.

FIG. 5 shows a schematic diagram of the embodiment in FIG. 4. The clamp circuit adopts a P-type MOSFET as a clamp circuit device. An ESD protection apparatus 500 includes a clamp circuit 510, a control circuit 530 and a detection circuit 550. For example, the clamp circuit 510 includes at least a transistor as the transistor Mclamp shown in FIG. 5. The transistor Mclamp is a P-type MOSFET. The clamp circuit 510 has a first terminal N1, a second terminal N2, a control terminal Nc and a coupling terminal Ncoupling respectively coupled to a source, a drain, a gate and a substrate terminal Nwell of the MOSFET. Further, the detection circuit 550 includes at least one diode-connected transistor Mpd, e.g., a PMOS transistor device, coupled to the coupling terminal Ncoupling of the clamp circuit 510 and a first rail line, e.g., VDD. The detection circuit 550 may be implemented by a device having an equivalent resistance, e.g., a resistor and a combination of other transistors. The control circuit 530 is similar to the control circuit 230 in FIG. 2.

Figure 6:
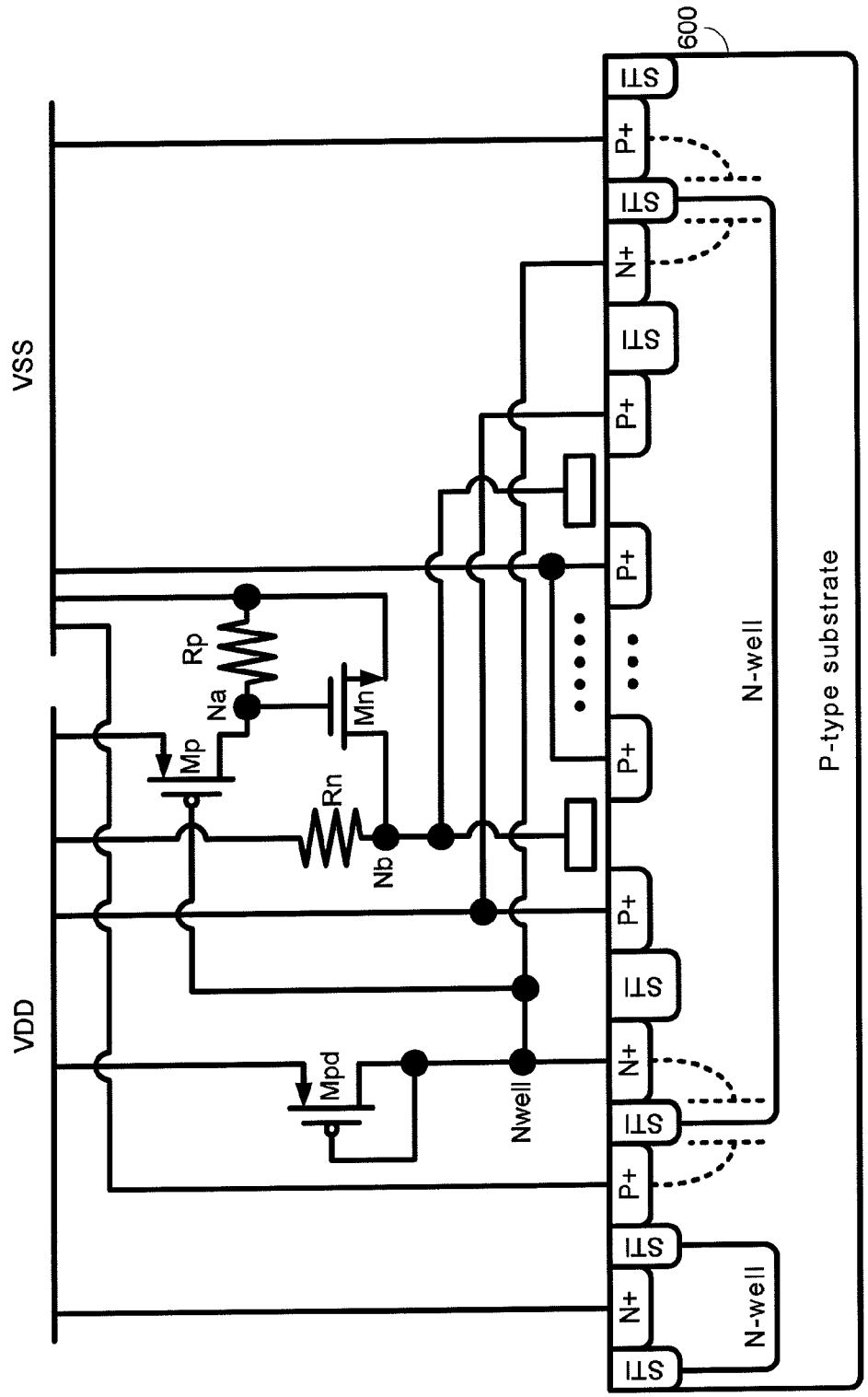
FIG. 6 is a circuit layout of the embodiment in FIG. 5.

The ESD protection apparatus 500 in FIG. 5 utilizes a parasitic capacitance of an ESD clamp device Mclamp as a part of the ESD detection mechanism. FIG. 6 shows a circuit layout of the embodiment in FIG. 5. An Mclamp 600 shows a sectional view of a PMOS transistor manufactured by a standard CMOS layout process as the Mclamp. A parasitic diode for providing a junction capacitance is formed between a drain and a substrate of the Mclamp. The substrate terminal Nwell generates a coupling potential in the occurrence of an ESD event. A P+/Nwell junction capacitance is formed between the semiconductor structure of a P+ guard ring surrounding Mclamp and the N-well. Contributed by the above junction capacitances, a sufficient coupling potential is generated at the substrate terminal Nwell in the occurrence of an ESD event.

A main difference between the ESD protection apparatus 200 in FIG. 2 and the ESD protection apparatus 500 in FIG. 5 is that the switching between the P-type transistor and the N-type transistor. Both the circuit structures are symmetrical and operate based on similar principles. Operating principles of the ESD protection apparatus 500 may be inferred from details of the embodiment in FIG. 2 by a person skilled in the art, and shall not be repeated for brevity.

Apart from being respectively implemented by an NMOS transistor and a PMOS transistor as FIGS. 2 and 5, the clamp circuit in the ESD protection apparatus may also be realized by other transistors or other equivalent circuits, e.g., a bipolar junction transistor (BJT).

Figure 7:
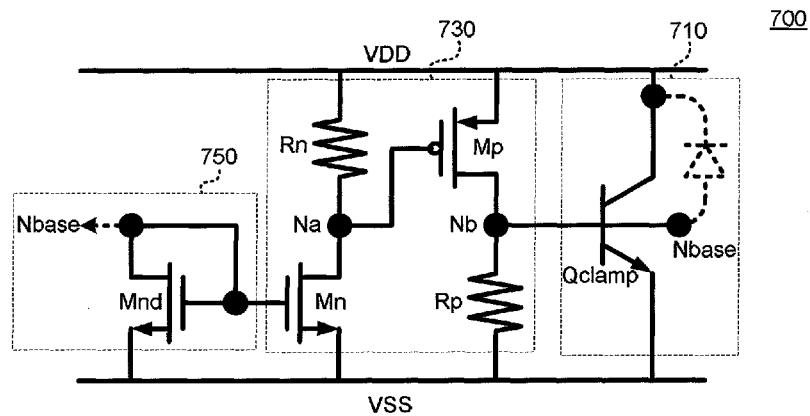
FIG. 7 is a schematic diagram of the embodiment in FIG. 1, wherein an NPN BJT is utilized as a clamp device.

FIG. 7 shows a schematic diagram of an ESD protection apparatus 700 according to another embodiment. A main difference between the ESD protection apparatus 700 and the embodiment in FIG. 2 is that, a clamp circuit 710 includes an NPN BJT, e.g., an NPN BJT as a clamp circuit device. The clamp circuit 710 has a first terminal, a second terminal and a control terminal respectively coupled to a collector, an emitter and a base Nbase of the BJT. The clamp circuit 710 further has a coupling terminal coupled to the base Nbase of the BJT. The base Nbase is also coupled to a detection circuit 750. A parasitic diode for providing a junction capacitance is formed between the collector and the base of the BJT. Accordingly, in the occurrence of an ESD event, the coupling terminal of the clamp circuit generates a corresponding coupling potential. In response to the coupling potential, the control circuit 730 is enabled to output a conduction signal $S_C$ at a node Nb to conduct Qclamp of the clamp circuit 710, so that ESD between a first rail line and a second rail line is performed through the clamp circuit 710.

Figure 8:
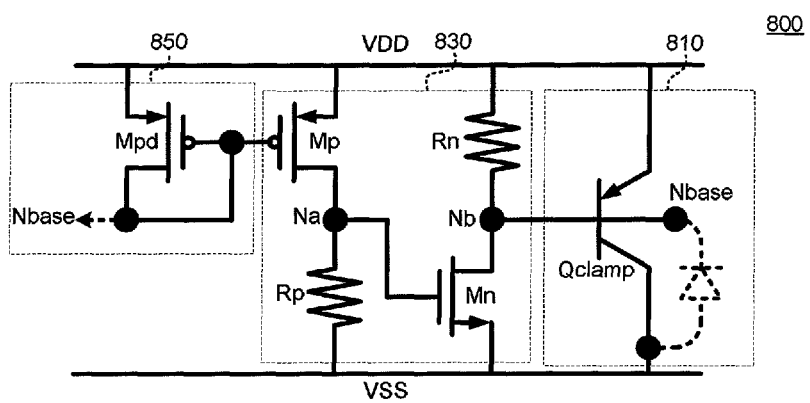
FIG. 8 is a schematic diagram of the embodiment in FIG. 4, wherein a PNP BJT is utilized as a clamp device.

FIG. 8 shows a schematic diagram of the embodiment in FIG. 4. A main difference between an ESD protection apparatus 800 in this embodiment and the embodiment in FIG. 4 is that, a clamp circuit 810 includes a PNP BJT, e.g., a PNP BJT as a clamp circuit device.

The embodiments in FIGS. 7 and 8 and the embodiment in FIGS. 2 and 5 are symmetrical and operate based on similar principles. Operating principles of embodiment in FIGS. 7 and 8 may be inferred from details of the embodiment in FIGS. 2 and 5 by a person skilled in the art, and shall not be repeated for brevity.

Further, approaches for implementing the clamp circuit is not limited to the above embodiments. For example, circuit devices or device combinations having the same functions as the clamp circuit in FIG. 1 or FIG. 4 may be utilized for realizing the clamp circuit.

Figure 9:
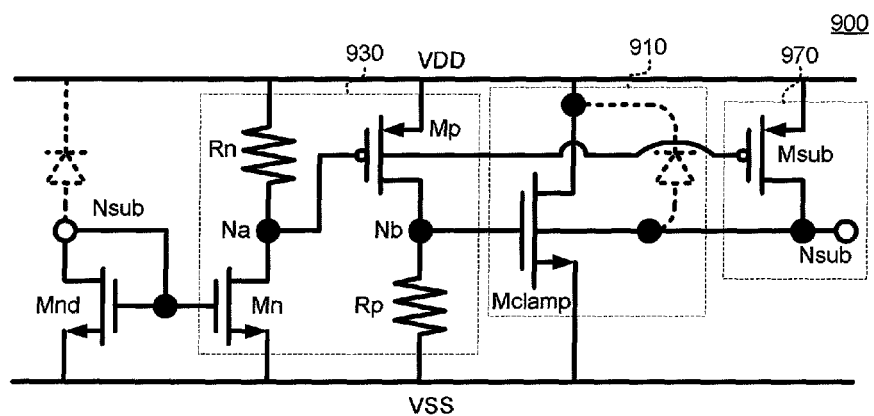
FIGS. 9 and 10 are respectively schematic diagrams of the embodiments in FIGS. 1 and 4 additionally provided with a substrate-triggered device.
Figure 10:
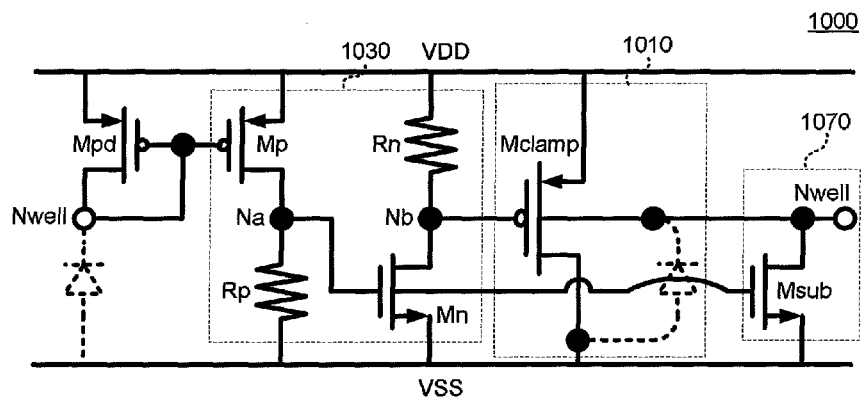

FIGS. 9 and 10 respectively show schematic diagrams of the embodiments in FIGS. 1 and 4 additionally provided with a substrate-triggered element according to other embodiments. Referring to FIG. 9, on top of implementing an ESD protection apparatus 900 with reference to the embodiment in FIG. 1 (e.g., in FIG. 2), the ESD protection apparatus 900 further includes a substrate-triggered element 970. For example, the substrate-triggered element 970 includes a transistor Msub. A main difference between the embodiments in FIGS. 9 and 2 is that, in the embodiment in FIG. 9, a device of an opposite type to the clamp device is additionally provided to add a substrate-triggered mechanism. Thus, apart from the inversion layer channel, the clamp device may further increase efficiency for releasing an ESD current through the conduction of a parasitic BJT formed by the substrate-triggered mechanism. In other words, in the occurrence of an ESD event, the substrate-triggered mechanism adds an ESD current path between the two rail lines.

The transistor Msub includes a first terminal, a second terminal and a control terminal (e.g., respectively a source, a drain and a gate of the transistor Msub). The substrate-triggered element 970 has a first terminal and a second terminal respectively coupled to a first rail line and a coupling terminal Ncoupling of a clamp circuit 910. When a control circuit 930 is enabled, the control circuit 930 conducts the substrate-triggered element 970 through a control terminal of the substrate-triggered element 970. Thus, for example, the control terminal of the transistor Msub is coupled to a node of the control circuit 930, e.g., to a node Na, an output terminal of an inverting circuit consisted of a transistor Mn and a resistor Rn, an input terminal of an inverting circuit consisted of a transistor Mp and a resistor Rp, or a multi-stage inverting circuit of the control circuit 930. When the control circuit 930 is enabled, a potential at the node Na is VSS so that the transistor Msub is conducted.

Referring to FIG. 10, an ESD protection apparatus 1000 may be implemented with reference to the embodiment in FIG. 4, and further includes a substrate-triggered element 1070. For example, the substrate-triggered element 1070 includes a transistor Msub. A main difference between the embodiments in FIGS. 10 and 5 is that, a device of an opposite type to the clamp device is additionally provided to add a substrate-triggered mechanism. Thus, apart from the inversion layer channel, the clamp device may further increase efficiency for releasing an ESD current through the conduction of a parasitic BJT formed by the triggered-substrate mechanism. The circuit structures in FIGS. 9 and 10 are symmetrical and operate based on similar principles, and so operating details of the circuits shall not be repeated for brevity.

A method for an ESD protection apparatus is further provided according to an embodiment of the present disclosure. The method includes steps of: providing a clamp circuit having a first terminal, a second terminal, a control terminal and a coupling terminal, the first terminal and the second terminal being respectively coupled to a first rail line and a second rail line (e.g., the clamp circuit in the foregoing embodiments); coupling a detection circuit between the coupling terminal of the clamp circuit and one of the first and second rail lines; in response to an ESD event, generating a first coupling potential at the coupling terminal of the clamp circuit, the first coupling potential being generated by a parasitic capacitance or a junction capacitance of the clamp circuit; in response to the first coupling potential, outputting a detection signal $S_D$ by a detection circuit; in response to the detection signal $S_D$, outputting a conduction signal $S_C$ by a control circuit to the control terminal of the clamp circuit to conduct the clamp circuit; and, in response to the conduction signal $S_C$, performing ESD between the first and second rail lines through the conducted clamp circuit. The method is applicable to not only the ESD protection apparatus of the above embodiments but also ESD protection apparatus implemented by other circuit structures.

A simulation carried out according to the ESD protection apparatus in the embodiment in FIG. 2 shall be illustrated below.

Figure 11:
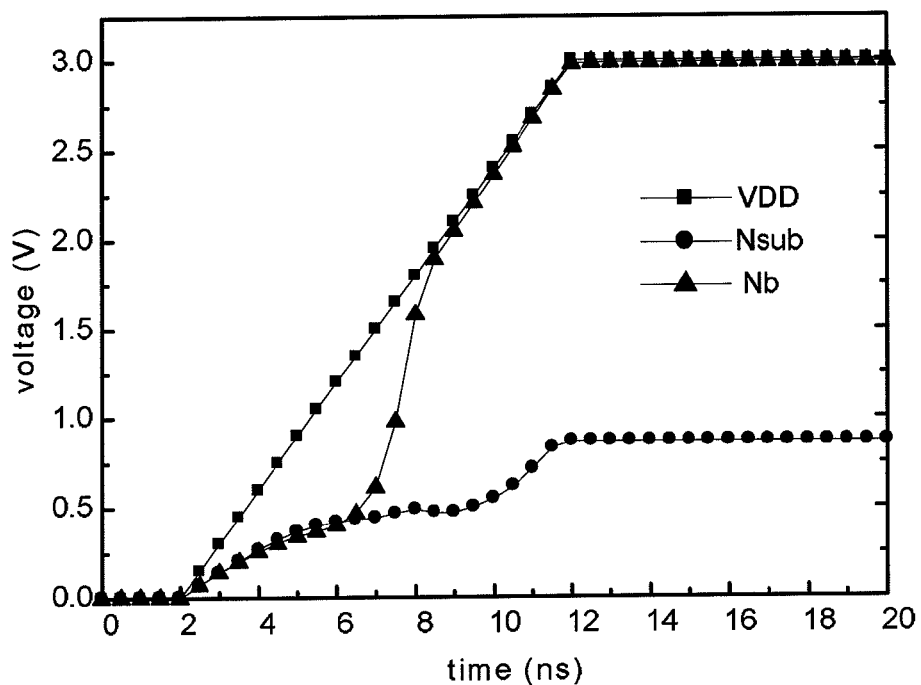
FIG. 11 is a diagram of simulation results of node voltages in an initial period of performing ESD according to the embodiment in FIG. 2.

FIG. 11 shows a diagram of simulation results of node voltages in an initial period of performing ESD according to the embodiment in FIG. 2. In FIG. 11, transient changes of voltages at nodes VDD, Nsub and Nb of the clamp circuit are simulated in an initial period of an ESD event. When a surge having a 3V voltage is applied to a power rail line VDD at a rising time of 10 ns, it is observed that the voltage at the node Nb is pulled up to a same level as that of the VDD power rail line, and so the clamp circuit is also conducted to release an ESD current at the same time.

Figure 12:
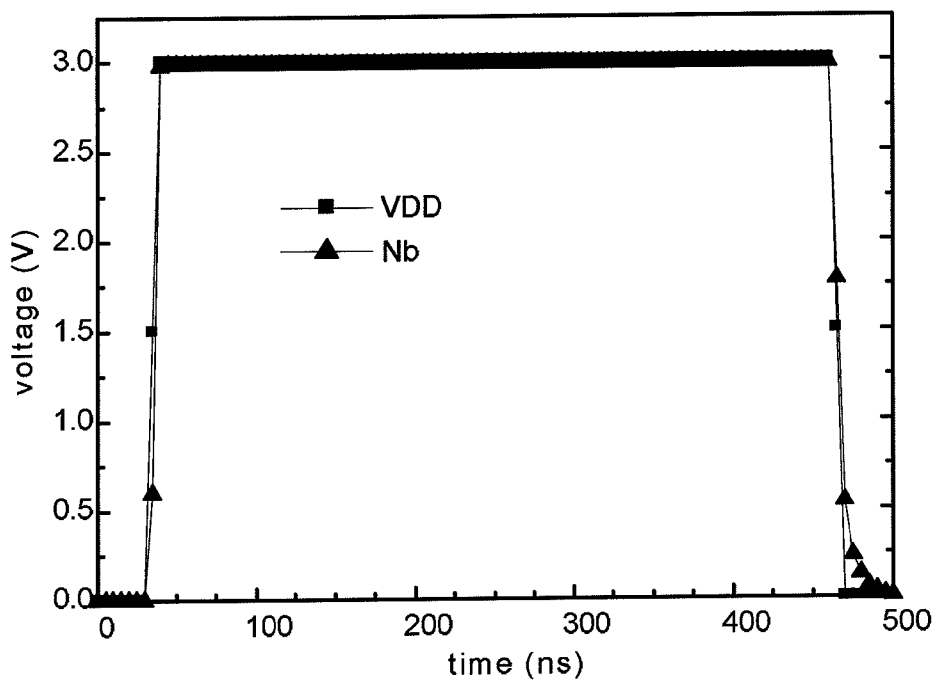
FIG. 12 is a diagram of simulation results of node voltages in a full-period of performing ESD according to the embodiment in FIG. 2.

FIG. 12 shows a diagram of simulation results of node voltages in a full-duration of ESD according to the embodiment in FIG. 2. It is observed from the simulation results in FIG. 12 that, in the occurrence of a surge of ESD in the ESD protection apparatus according to an embodiment, although the detection circuit and the control circuit do not include a feedback mechanism, the voltage at the node Nb is maintained at a same voltage level as that of the VDD power rail line for a considerable period of time. The above feature is capable of maintaining the protection capability of the clamp circuit by preventing the clamp circuit from shutting down before the ESD current is completely released.

Figure 13:
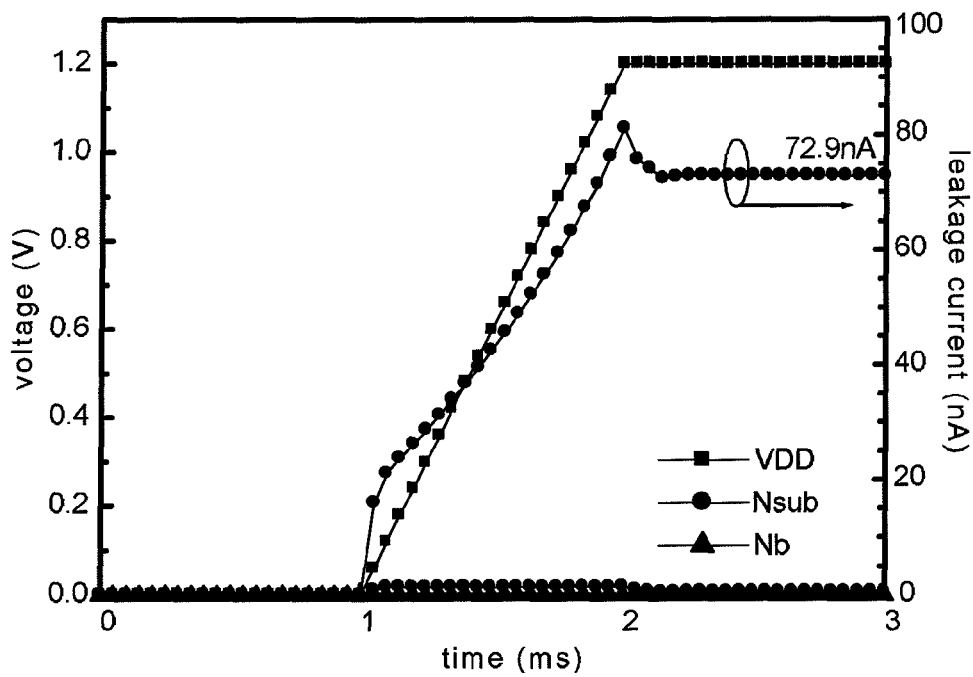
FIG. 13 is a diagram of simulation results for power-on under a normal operating mode and a leakage current according to the embodiment in FIG. 2.

FIG. 13 shows a diagram of simulation results for power-on under a normal operating mode and a leakage current according to the embodiment in FIG. 2. When a normal operating voltage of 1.2V is applied to the VDD power rail line at a rising time of 1 ms, the leakage current of the clamp circuit is merely around 72.9 nA while the clamp device is maintained at a turned-off state due to the voltage at the node Nb. Thus, the ESD protection apparatus of this embodiment remains turned-off under normal operating conditions.

Figure 14:
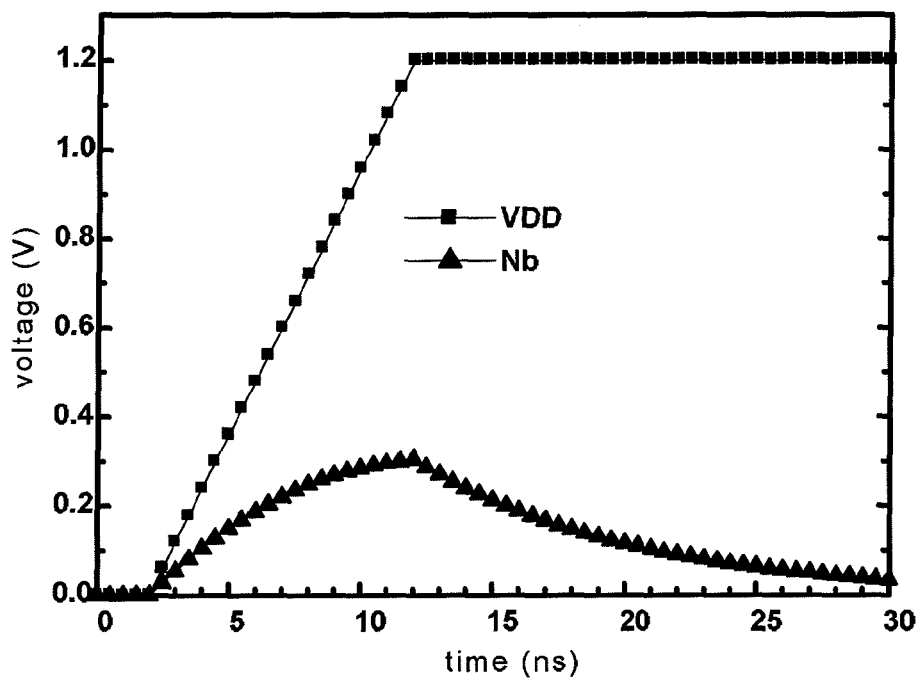
FIG. 14 is a diagram of simulation results of node voltages under a fast power-on operating mode according to the embodiment in FIG. 2.

FIG. 14 illustrates simulation results of node voltages under a fast power-on operating mode according to the embodiment in FIG. 2. The condition for simulation is deliberately assigned so that the rising time for the voltage of a power source is set to 10 ns. The simulation results show that the voltage at the node Nb of the ESD clamp device Mclamp, under this condition, merely rises to about 0.3V, which is less than a threshold of 0.58V for the clamp device Mclamp. Thus, it will not lead to mistrigger in the ESD protection apparatus of the embodiment under fast power-on condition.

Figure 15:
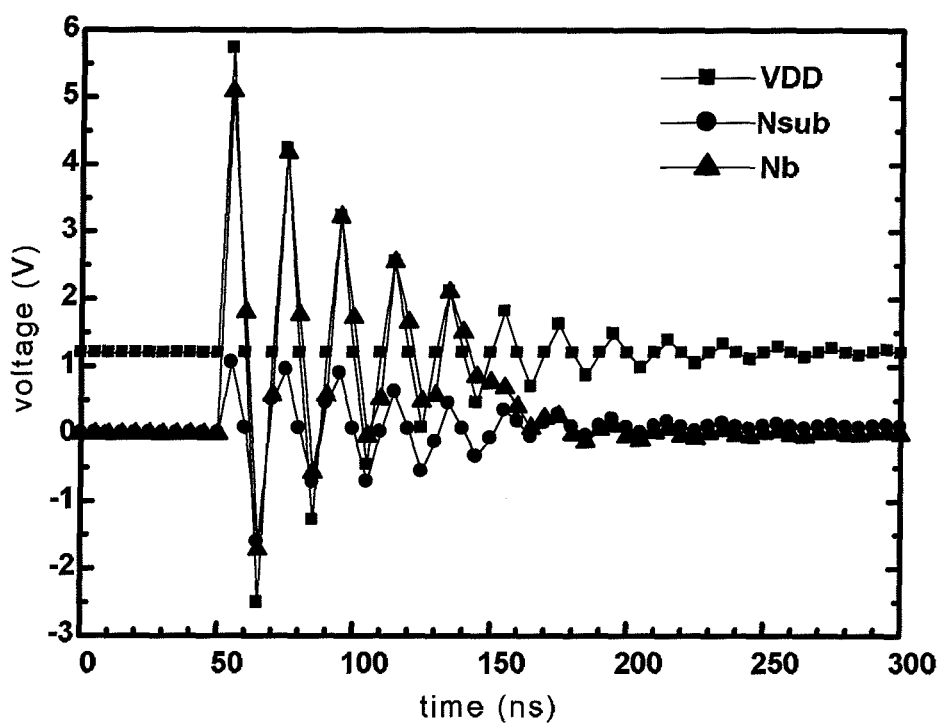
FIG. 15 is a diagram of simulation results of node voltages according to the embodiment in FIG. 2 encountering transient-induced latch-up effects under a normal operating mode.

FIG. 15 shows a diagram of simulations results of node voltages according the embodiment in FIG. 2 encountering a transient-induced latch-up under a normal operating mode. A fast-jittering voltage surge is applied to a VDD power rail line operating at 1.2V. When the voltage of the surge is too high, the voltage at the node Nb is also pulled up such that the Mclamp device is conducted to protect internal circuits. When the surge is about to end, small jitters at that time are insufficient to turn on the ESD detection circuit, and so the voltage at the node Nb also becomes moderate to further return to the ground level. Therefore, the ESD protection apparatus of this embodiment is in a turned-off state after the fast-jittering voltage surge is ended, thereby leaving no issues caused by transient-induced latch-up effects.

In the ESD protection apparatus according to the above embodiments, a parasitic capacitance of an ESD clamp device is utilized as a part of an ESD detection mechanism. The disclosed structure not only fully utilizes the innate parasitic capacitance of the ESD clamp device, but also provides an ESD detection mechanism through the coupling of the coupling terminal of the clamp circuit and the detection circuit. In certain embodiments, the structure above appropriately achieves ESD. More specifically, the clamp circuit is conducted in the occurrence of an ESD event and is turned off when the ESD event ends, and so the structure is immune from issues that are resulted by transient-induced latch-up effects. In other embodiments, the structure effectively reduces a layout area required for implementing the ESD protection apparatus since additional capacitance devices are not necessarily required.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An electrostatic discharge (ESD) protection apparatus, comprising:
a clamp circuit, comprising a first terminal, a second terminal, a control terminal and a coupling terminal, the first terminal and the second terminal of the clamp circuit being respectively coupled to a first rail line and a second rail line, the coupling terminal of the clamp circuit generating a first coupling potential in response to an ESD event; and
a detection circuit, comprising a first terminal and a second terminal, the first terminal of the detection circuit directly coupled to the coupling terminal of the clamp circuit and a control circuit, the second terminal of the detection circuit which is different from the first terminal directly coupled to the second rail line, wherein the detection circuit outputs a detection signal in response to the first coupling potential;
wherein the control circuit is coupled to the first rail line, the second rail line, the detection circuit and the clamp circuit, the control circuit being enabled to output a conduction signal to the control terminal of the clamp circuit in response to the detection signal; and
wherein the clamp circuit is conducted in response to the conduction signal so that ESD between the first rail line and the second rail line is performed through the clamp circuit.

2. The apparatus according to claim 1, wherein the coupling terminal of the clamp circuit is at a second coupling potential in response to an end of the ESD event so as to turn off the clamp circuit.

3. The apparatus according to claim 1, wherein the clamp circuit comprises a transistor, and a parasitic diode for providing a junction capacitance is formed between the first terminal and the coupling terminal of the clamp circuit.

4. The apparatus according to claim 3, wherein the transistor is a metal oxide semiconductor field effect transistor (MOSFET), and the first terminal, the second terminal, the control terminal and the coupling terminal of the clamp circuit are respectively coupled to a drain, a source, a gate and a substrate terminal of the MOSFET.

5. The apparatus according to claim 4, wherein the clamp circuit further comprises a guard-ring semiconductor structure, and a parasitic diode for providing a junction capacitance is formed between the guard-ring semiconductor structure and the substrate terminal.

6. The apparatus according to claim 3, wherein the transistor is a bipolar junction transistor (BJT), and the first terminal, the second terminal, the control terminal and the coupling terminal of the clamp circuit are respectively coupled to a collector, an emitter, a base and the base of the BJT.

7. The apparatus according to claim 3, further comprising a substrate-triggered element, the substrate-triggered element comprising a transistor having a first terminal, a second terminal and a control terminal, the first terminal and the second terminal of the substrate-triggered element being respectively coupled to the first rail line and the coupling terminal of the clamp circuit;
wherein when the control circuit is enabled, the control circuit conducts the substrate-triggered element through the control terminal of the substrate-triggered element, and the transistor of the substrate-triggered element is an opposite type to the transistor of the clamp circuit.

8. The apparatus according to claim 1, further comprising a substrate-triggered element, the substrate-triggered element comprising a transistor having a first terminal, a second terminal and a control terminal, the first terminal and the second terminal of the substrate-triggered element being respectively coupled to the first rail line and the coupling terminal of the clamp circuit;
wherein when the control circuit is enabled, the control circuit conducts the substrate-triggered element through the control terminal of the substrate-triggered element.

9. The apparatus according to claim 8, wherein the control circuit comprises a first inverting circuit and a second inverting circuit, the first inverting circuit has an output terminal coupled to an input terminal of the second inverting circuit, and the second inverting circuit has the input terminal coupled to the control terminal of the substrate-triggered element.

10. The apparatus according to claim 1, wherein the control circuit comprises a first inverting circuit and a second inverting circuit, the first inverting circuit has an output terminal coupled to an input terminal of the second inverting circuit, and the second inverting circuit has an output terminal coupled to the control terminal of the clamp circuit.

11. The apparatus according to claim 1, wherein the control circuit comprises a plurality of inverting circuits, and one inverting circuit of the inverting circuits has an output terminal coupled to the control terminal of the clamp circuit.

12. The apparatus according to claim 1, wherein the detection circuit comprises a diode-connected transistor, and the diode-connected transistor has a first terminal coupled to the coupling terminal of the clamp circuit and the control circuit, and a second terminal coupled to the second rail line.

13. The apparatus according to claim 1, wherein the detection circuit comprises an equivalent resistor, and the equivalent resistor has a first terminal coupled to the coupling terminal of the clamp circuit and the control circuit, and a second terminal coupled to the second rail line.

14. A method for an ESD protection circuit, comprising:
providing a clamp circuit, the clamp circuit comprising a first terminal, a second terminal, a control terminal and a coupling terminal, the first terminal and the second terminal of the clamp circuit respectively being coupled to a first rail line and a second rail line;
directly coupling a first terminal of a detection circuit to the coupling terminal of the clamp circuit and a control circuit;
directly coupling a second terminal of detection circuit which is different from the first terminal to one of the first and second rail lines;
in response to an ESD event, generating a first coupling potential at the coupling terminal of the clamp circuit;
in response to the first coupling potential, outputting a detection signal by the detection circuit;
in response to the detection signal, outputting a conduction signal to the control terminal of the clamp circuit by the control circuit to conduct the clamp circuit; and
in response to the conduction signal, performing ESD between the first and second rail lines through the conducted clamp circuit.

15. The method according to claim 14, wherein the clamp circuit is at a second coupling potential in response to an end of the ESD event to turn off the clamp circuit.

16. The method according to claim 14, wherein the first coupling potential is generated by a parasitic capacitance or a junction capacitance of the clamp circuit.

17. The method according to claim 14, wherein the clamp circuit comprises a transistor, and a parasitic diode for providing a junction capacitance is formed between the first terminal and the coupling terminal of the clamp circuit.

18. The method according to claim 17, wherein the transistor is a MOSFET, and the first terminal, the second terminal, the control terminal and the coupling terminal of the clamp circuit are respectively coupled to a drain, a source, a gate and a substrate terminal of the MOSFET.

19. The method according to claim 18, wherein the clamp circuit further comprises a guard-ring semiconductor structure, and a parasitic diode for providing a junction capacitance is formed between the guard-ring semiconductor structure and the substrate terminal.

20. The method according to claim 17, wherein the transistor is a BJT, and the first terminal, the second terminal, the control terminal and the coupling terminal of the clamp circuit are respectively coupled to a collector, an emitter, a base and the base of the BJT.

21. The method according to claim 14, further comprising:
coupling a substrate-triggered element to one of the first and second rail lines and the coupling terminal of the clamp circuit; and
in response to the first coupling potential, conducting the substrate-triggered element through the detection circuit.

22. The method according to claim 14, wherein the detection circuit comprises a diode-connected transistor, and the diode-connected transistor has a first terminal coupled to the coupling terminal of the clamp circuit and the control circuit, and a second terminal coupled to the second rail line.

23. The method according to claim 14, wherein the detection circuit comprises an equivalent resistor, and the equivalent resistor has a first terminal coupled to the coupling terminal of the clamp circuit and the control circuit, and a second terminal coupled to one of the first and second rail lines.

24. The method according to claim 14, wherein the control circuit comprises a plurality of inverting circuits, and one inverting circuit of the inverting circuits has an output terminal coupled to the control terminal of the clamp circuit.

* * * * *